United States Patent [19]
Eide

[11] Patent Number: 6,014,316
[45] Date of Patent: Jan. 11, 2000

[54] IC STACK UTILIZING BGA CONTACTS

[75] Inventor: Floyd K. Eide, Huntington Beach, Calif.

[73] Assignee: Irvine Sensors Corporation, Costa Mesa, Calif.

[21] Appl. No.: 09/095,416

[22] Filed: Jun. 10, 1998

Related U.S. Application Data

[60] Provisional application No. 60/049,582, Jun. 13, 1997.

[51] Int. Cl.$^7$ .............................. H05K 1/18; H05K 1/11; H01L 23/50; H01L 23/488
[52] U.S. Cl. ...................... 361/735; 257/686; 257/777; 257/738
[58] Field of Search .................................... 174/524, 254; 29/827, 829, 830, 834, 835, 838; 228/180.21, 180.22, 690, 693; 257/688, 685, 686, 777, 737, 738, 778, 780; 361/735, 790, 749; 438/109, 612, 613; 439/68, 69; 365/51, 52, 63

[56] References Cited

U.S. PATENT DOCUMENTS

| | | | |
|---|---|---|---|
| 4,833,568 | 5/1989 | Berhold | 361/735 |
| 5,166,866 | 11/1992 | Kim et al. | 361/749 |
| 5,484,959 | 1/1996 | Burns | 174/52.4 |
| 5,568,363 | 10/1996 | Kitahara | 174/254 |
| 5,631,193 | 5/1997 | Burns | 29/827 |
| 5,736,780 | 4/1998 | Murayama | 257/693 |
| 5,767,528 | 6/1998 | Sumi et al. | 257/738 |
| 5,790,380 | 8/1998 | Frankeny | 361/735 |

FOREIGN PATENT DOCUMENTS 10-303251  11/1998  Japan.

*Primary Examiner*—Donald Sparks
*Attorney, Agent, or Firm*—Thomas J. Plante

[57] ABSTRACT

A structure and process are disclosed in which IC chip-containing layers are stacked to create electronic density. Each layer is fabricated by forming one or more flexible circuit around a TSOP. Each flexible circuit contains conductors which are disposed to connect with TSOP leads, transpose signals to or from various locations on the top or bottom of the TSOP, and/or terminate in ball grid contacts for connection to other layers in the stack. The flexible circuit is bonded to the TSOP such that ball grid contacts are exposed on the top and bottom of the TSOP, and the ball grid array contacts on the bottom of the lowest layer are disposed to facilitate connection with a PCB or other circuitry.

12 Claims, 4 Drawing Sheets

IC STACK UTILIZING BGA CONTACTS

This application claims the benefit of U.S. Provisional Application Ser. No. 60/049,582, filed Jun. 13, 1997.

BACKGROUND OF THE INVENTION

This invention relates to the stacking of layers containing IC (integrated circuit) chips, thereby obtaining high density electronic circuitry. In general, the goal of the present invention is to combine high circuit density with reasonable cost. A unique aspect of this invention is that it stacks IC layers as TSOP's (thin small outline packages) in a footprint smaller than the TSOP footprint itself. Cost reduction is accomplished by relatively low cost forming of individual layers and the ability to incorporate off-the-shelf prepackaged and pre-tested IC's into stacks.

Another aspect of successful stacking of chip-containing layers is the ability of the BGA (ball grid array) interconnection to cheaply provide a large number of non-common (non-bussed) connections between individual layers themselves and the substrate to which the stack is attached.

The prior art contains several examples where a flexible circuit is used to interconnect unpackaged chips. Yamaji U.S. Pat. No. 5,394,303 shows a structure in which a flexible film with wiring layers is wrapped around a semiconductor chip, providing an increase in the number of terminals and a second surface for interconnections. McMahon U.S. Pat. No. 5,362,656 shows a structure in which a flexible circuit is used to route signals from interconnections with the top surface of the chip to ball connectors below the chip substrate. Paurus et al. U.S. Pat. No. 5,448,511 and Kimura U.S. Pat. No. 5,313,416 disclose schemes for creating a memory stack by interconnecting a series of memory devices or memory IC chips on a fan-folded flexible circuit board which carries the signals from the various IC chips to each other and out the bottom of the stack to the main PCB. Behelen et al. U.S. Pat. No. 5,598,033 shows a structure in which a flexible circuit is used to interconnect a semiconductor IC die to BGA contacts on another die displaced laterally, so that two stacks of dice can be interconnected in a zigzag manner.

What is not available in the prior art is a stack of IC chip-containing TSOP layers which are fully tested individually prior to stacking, can connect layers in the stack with each other and with the bottom surface of the stack using BGA's, and can provide custom interconnections including the separate connection of individual layer signals to the bottom of the stack. The current invention allows a large I/O count for mixed IC stacking or wide data paths, such as the assembly of wide word memory from layers of memory IC's having smaller word widths. Additionally, the current invention allows stacks having a smaller footprint than their constituent TSOP's, and allows them to be produced at low cost.

SUMMARY OF THE INVENTION

This application discloses a version of a fully pre-tested IC-containing layer, which can be stacked and electrically connected by ball grid array contacts on each level of the stack. This application further discloses a method for starting with a standard TSOP package and manufacturing an IC-containing layer with ball grid array contacts ready for stacking with other layers in order to provide a dense electronic package.

The TSOP leads are trimmed close to the TSOP body. At this point, the edges of the TSOP body may be mechanically rounded to improve the bending radius of the applied flexible circuit. A flexible circuit containing conductors with exposed sections prepared for joining with the TSOP leads, and other exposed sections prepared with bumps suitable for use as ball grid contacts is fabricated, with the conductors arranged so as to give the desired connections. Using an appropriately shaped heated fixture, the flexible circuit is formed into such a shape that it will slip over one of the leaded edges of the TSOP. The flexible circuit is then bonded to the TSOP such that the appropriate exposed conductors of the flexible circuit contact the trimmed leads of the TSOP. The assembly is then dipped into high-melting-temperature solder in order to accomplish a soldered connection between the trimmed TSOP leads and the contacting exposed conductors of the bonded flexible circuit.

Each layer is completed before stacking. Ordinarily, pre-tested TSOP's can be used, eliminating the requirement for testing. For special applications, additional testing may conveniently be accomplished by testing the ball grid array layer using a production-testing fixture which contacts the ball grid contacts. Functional testing may include:

a) Testing at extreme temperatures (e.g., minus 55° C. to plus 125° C.);

b) Burned in (both temperature and bias); and c) Environmentally screened (i.e., temperature cycle, thermal shock, humidity, bias)

The availability of the full top and bottom surfaces of the layer for ball grid terminals, the ability to transpose connections to different ball grid contact positions by arranging the geometry of the conductors in the flexible circuit, and the large number of vertical interconnections, allow for a very high input/output (I/O) count to accommodate the needs of the stacked IC's.

Further, this application discloses stacked IC-containing devices having a smaller footprint than the original TSOP's used to make them, and methods for stacking the IC-containing layers to produce stacked IC-containing devices.

DETAILED DESCRIPTION

This invention consists of a stack of semiconductor IC's electrically and mechanically interconnected in the vertical direction. The end user of this stack will connect it to a substrate such as a printed circuit board (PCB). The vertical placement of IC's will save considerable substrate area as opposed to the conventional horizontal placement of an equivalent number of IC's on the substrate.

Figure 1A:
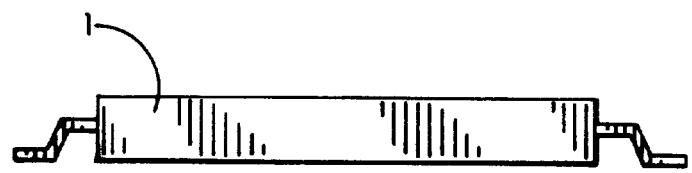
FIGS. 1(1a and 1b) shows a side view of a standard TSOP and a TSOP with the leads trimmed.
Figure 1B:
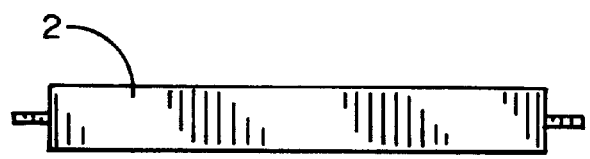

Each layer within the stack will consist of an off-the-shelf commercially available IC 1 in a thin small outline package (TSOP) processed in such a manner as to route the TSOP's electrical input/output (I/O) connections from the leads on the sides or the ends of the package to an array of metallic bumps or a ball grid array (BGA) on both the top surface and the bottom surface of the TSOP package. The routing process consists of the following steps:

Trim the TSOP's leads close to the TSOP body to approximately 0.015". A trimmed TSOP 2 is illustrated in FIG. 1.

Figure 2:
FIGS. 2 shows a side view of the TSOP after rounding of the package edges.
Figure 3:
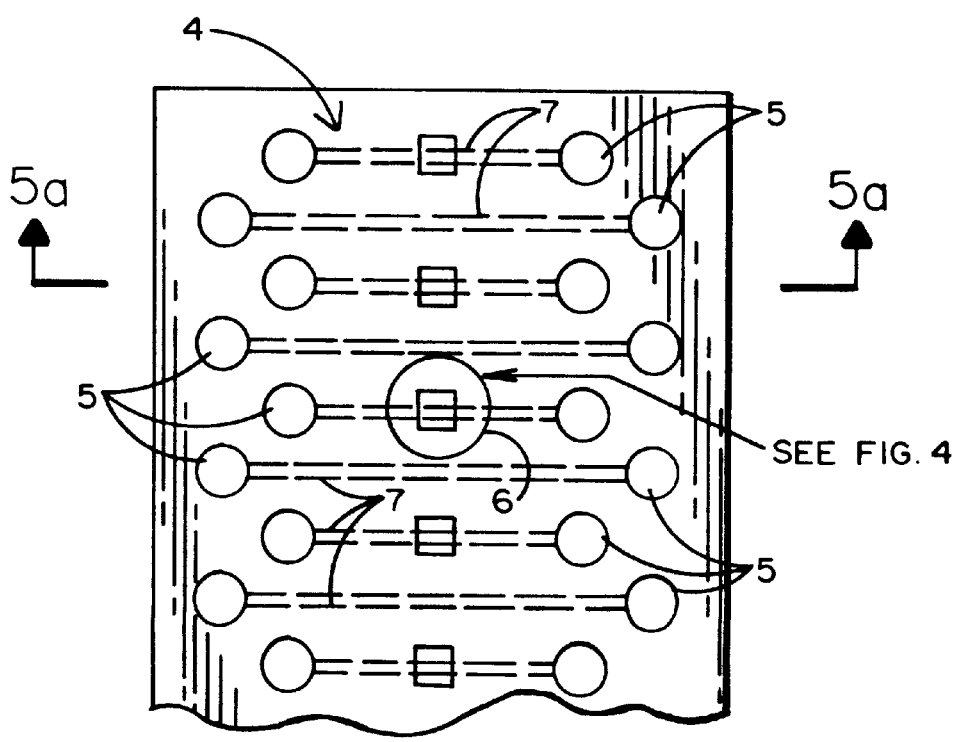
FIG. 3 shows a partial view of a flexible polyimide/metal conductor circuit.

The edges of the TSOP package may be optionally rounded 3 to reduce the bending radius of the polyimide/conductor circuit to be applied in step 7. A rounded TSOP package 3 is illustrated in FIG. 2. Fabricate a polyimide/metal conductor circuit 4 as shown in FIG. 3 containing conductors with ends that, through vias in the polyimide, terminate on metal balls or bumps 5 (achieved by electroplating or other methods). There is a hole in the polyimide 6 exposing a conductor element 7 near their mid-section where the conductor is intended to be joined with the TSOP leads on one side or end of the package. A second circuit will be fabricated to contact the leads on the opposite side or end of the TSOP package.

Figure 4A:
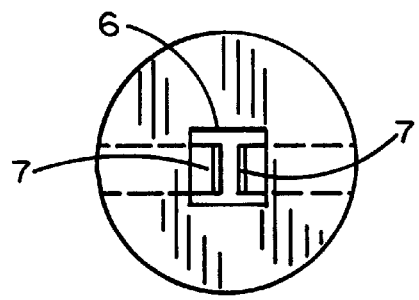
FIGS. 4(4a and 4b) shows an exploded view of a severed conductor in the polyimide hole.
Figure 4B:
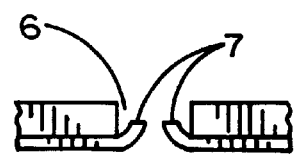

Using an appropriate fixture, sever the conductors 7 exposed in holes in the polyimide as shown in FIG. 4.

Figure 5A:
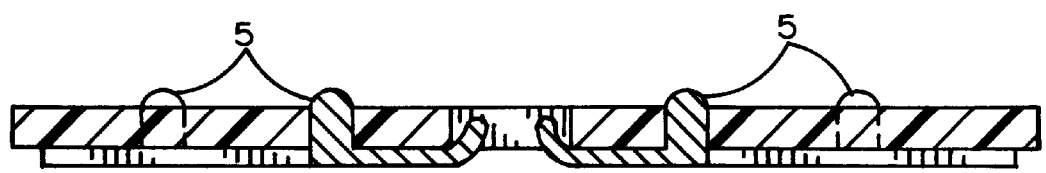
FIGS. 5(5a and 5b) shows a side view of flexible circuit of FIG. 3 before hot forming, and the same circuit after hot forming around the TSOP.
Figure 5B:
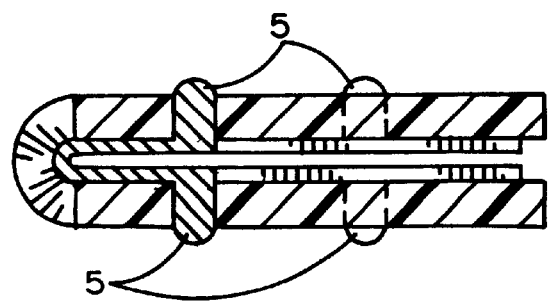

Using an appropriate heated fixture resembling the approximate shape of the TSOP, hot form the polyimide/metal conductor circuit into such a shape that it will slip over one of the leaded edges of the TSOP 8 as shown in FIG. 5. A second polyimide/conductor circuit similarly formed 9 will slip over the second leaded edge of the TSOP.

Apply a thermosetting epoxy adhesive to the top and bottom sides of the TSOP and partially cure the adhesive.

Slide the hot formed polyimide/metal conductor circuits over each side of the TSOP such that the trimmed TSOP leads penetrate the polyimide holes in the circuit and contact the severed metal conductors 10.

Figure 6:
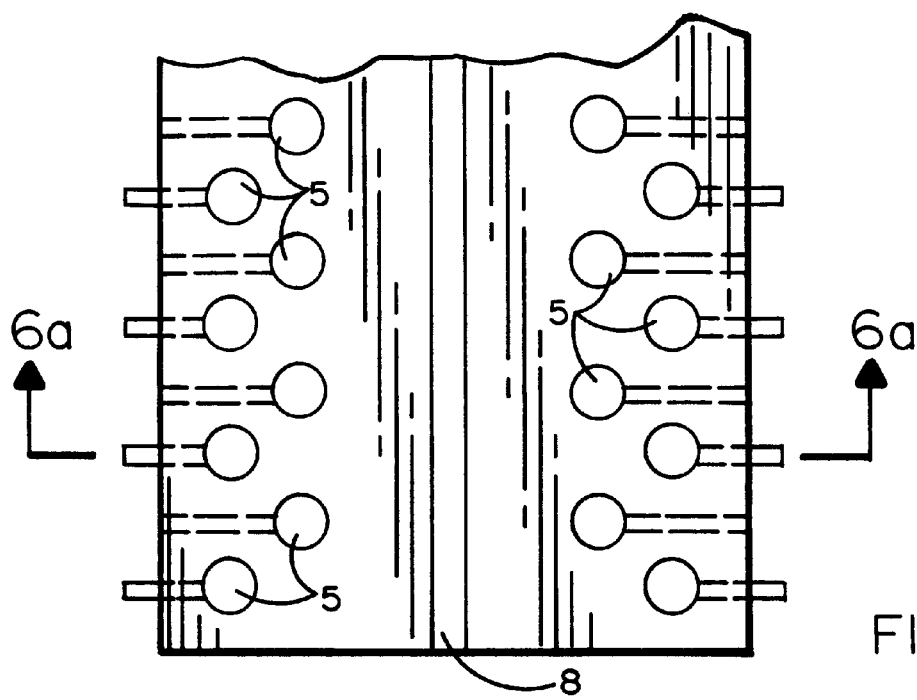
FIGS. 6(6a and 6b) shows a top view and side view of the BGA/TSOP assembly complete with two flexible circuits formed and bonded to it.
Figure 6A:
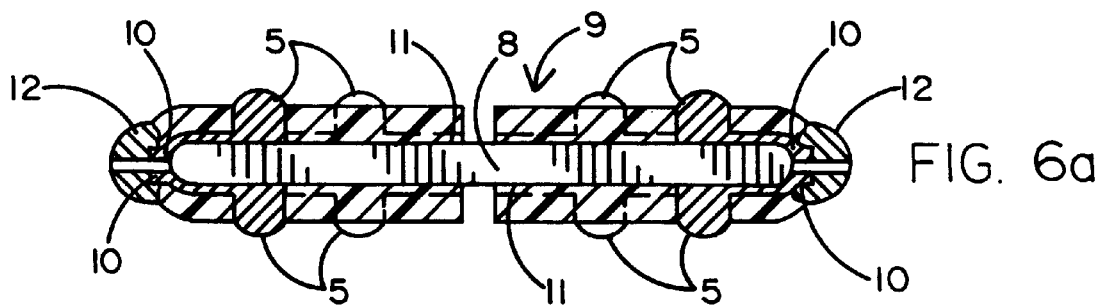

Using an appropriate fixture to hold the assembly in place, cure the epoxy adhesive 11 as shown in FIG. 6.

Dip the edges of the TSOP having leads into a high melting temperature solder 12 to accomplish an electrical connection between the TSOP trimmed leads and the severed and formed metal conductors within the polyimide/metal conductor circuit as shown in FIG. 6.

At this point the TSOP's electrical connections have been re-routed from the leads on the sides or ends of the body to a BGA on the top surface and/or the bottom surface of the TSOP's. It should be noted that not all bumps or balls 5 in the BGA are to be connected to a TSOP lead. Some conductors will use the space between leads simply to connect a ball or bump on the top TSOP surface with a ball or bump on the bottom TSOP surface. When the TSOP's are stacked, this allows for independent electrical connection from the bottom of the stack to individual TSOP's in the stack.

Figure 7:
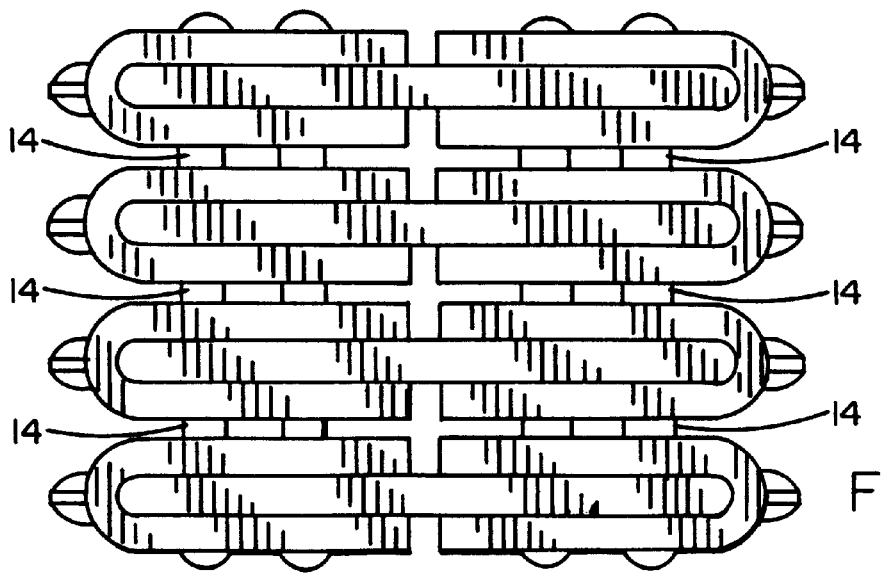
FIG. 7 shows an example four-high stack of BGA/TSOP assemblies with their BGA contacts joined with solder connections.

The processed TSOP's are now ready for stacking which is accomplished by printing or dispensing a high melting point solder part to the BGA locations on the top surface and/or the bottom surface of the processed TSOP's and then reflowing the solder paste in a convection or vapor phase reflow furnace (see FIG. 7). The solder 14 used in stacking and in connecting the polyimide/conductor circuit to the TSOP leads should have a melting point higher than the temperature the end user will use to connect the stack to the substrate.

What is unique about this invention is that it stacks TSOP's in a footprint smaller than the TSOP footprint itself and that the BGA interconnection between the layers of the stack provides for a large number of non-common (non-bussed) connections between individual layers themselves and individual layers and the substrate to which the stack is attached.

Figure 8:
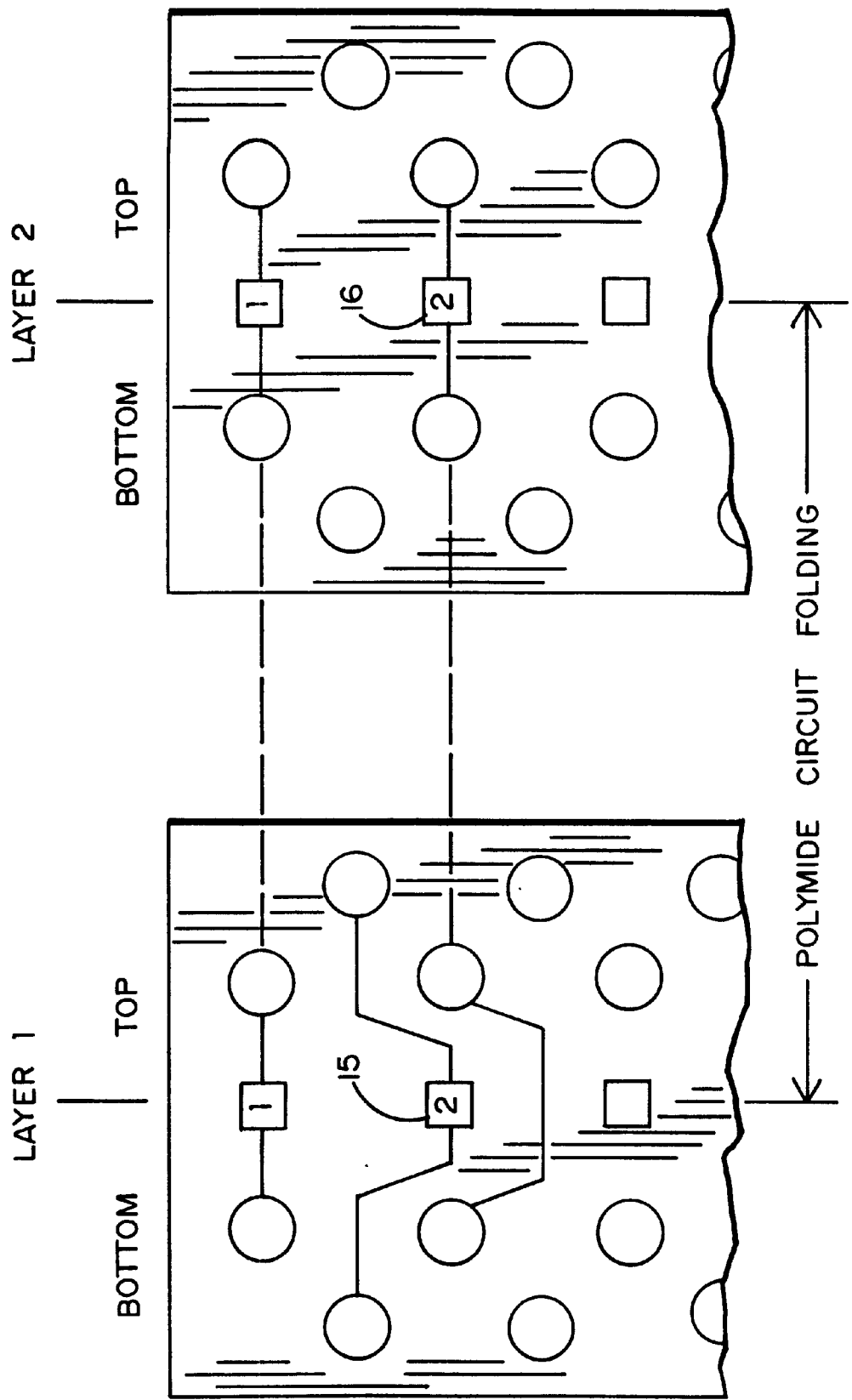
FIG. 8 shows two layers of a flexible circuit and illustrates the ability to make unique contact to upper layers in a stack.

FIG. 8 demonstrates how electrical contact 14 can be made vertically in the stack so as to connect each TSOP's pin 1 in common and bring it to the base of the stack. It also demonstrates how the pin 2 of a layer 1 TSOP 15 and pin 2 of a layer 2 TSOP 16 can each be brought out separately to different locations at the base of the stack. This re-route scheme continues for multiple layers of the stack enabling the ability to expand memory depth and memory width beyond that of the TSOP's in the stack and to stack IC's (other than memory) in the stack.

From the foregoing description, it will be apparent that the device and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A stack of IC chip-enclosing layers, comprising:
   an IC-containing layer comprising:
      a TSOP containing one or more IC chips and having I/O terminals thereon, and
      a flexible circuit, with exposed solderable contacts for connection to the TSOP terminals and ball grid contacts for connection with other layers in the stack, formed to fit over each terminal-bearing side of the TSOP; and
   a second IC-containing layer with ball grid contacts, supported on top of the lower layer and connected to the first layer via their respective ball grid contacts.

2. The structure of claim 1 in which:
   additional IC chip-containing layers are supported and connected on the top of the second layer.

3. The structure of claim 1 in which:
   the ball grid contacts on the upper surface of one or more layers do not all electrically connect with the corresponding ball grid contacts on the lower surface of the layer.

4. The structure of claim 1 in which:
   flat bump connectors are used instead of ball grid connectors.

5. The structure of claim 1, in which:
   one or more terminal-bearing sides of the TSOP in one or more layers are mechanically rounded to increase the bending radius of the flexible circuit.

6. A method of manufacturing an IC-containing layer ready for stacking with other layers in order to provide a dense electronic package comprising the steps of:
   fabricating, a flexible circuit including a top and a bottom surface with electrical conductors disposed to provide a desired connector geometry for connection of a TSOP with other layers;
   a ball grid array covering one of said top and bottom surface;

forming the flexible circuit so that it fits over a lead-bearing side of a TSOP; and bonding the flexible circuit to the TSOP so as to align exposed conductors of the flexible circuit in solderable contact with the TSOP leads.

7. The method of claim 6 which also comprises:

fabricating, forming, and bonding a second flexible circuit over the other lead-bearing side of a TSOP.

8. The method of claim 7 in which the flexible circuits provide a ball grid array covering substantially the entire top and bottom of the layer.

9. The method of claim 6 which also comprises:

stacking a plurality of the layers; and electrically interconnecting conductors in each layer with conductors in the adjacent layer.

10. The method of claim 9 in which pre-testing is performed on said TSOP's.

11. The method of claim 9 which also comprises:

testing, prior to stacking, for performance of the circuitry of each layer to establish the layer as a known good element.

12. The method of claim 11 in which the performance testing includes testing at extreme temperatures, testing through thermal cycles and thermal shock, and testing for performance under humidity conditions.

* * * * *